(12) United States Patent
Okayama

(10) Patent No.: US 6,995,457 B2
(45) Date of Patent: Feb. 7, 2006

(54) WIRING STRUCTURE AND MANUFACTURING METHOD THEREFOR, SEMICONDUCTOR DEVICE INCLUDING WIRING STRUCTURE AND WIRING BOARD

(75) Inventor: Yoshio Okayama, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/337,829

(22) Filed: Jan. 8, 2003

(65) Prior Publication Data

US 2003/0137053 A1   Jul. 24, 2003

(30) Foreign Application Priority Data

Jan. 10, 2002  (JP) ............................. 2002-003058
Dec. 16, 2002  (JP) ............................. 2002-363381

(51) Int. Cl.
   *H01L 23/48* (2006.01)
(52) U.S. Cl. .................... 257/664; 257/760; 257/758
(58) Field of Classification Search ............... 257/664, 257/752, 758–760
   See application file for complete search history.

(56) References Cited

U.S. PATENT DOCUMENTS 5,372,967 A * 12/1994 Sundaram et al. .......... 438/381
6,727,154 B2 * 4/2004 Gardner ....................... 438/329
2002/0102835 A1 * 8/2002 Stucchi et al. .............. 438/618

FOREIGN PATENT DOCUMENTS

| JP | 09-260375 | 10/1997 |
| JP | P2000-13113 A | 1/2000 |
| JP | P2002-50742 A | 2/2002 |
| JP | P2002-158227 A | 5/2002 |

OTHER PUBLICATIONS

U.S. Appl. No. 60/230,729.*

* cited by examiner

*Primary Examiner*—Tuan H. Nguyen
(74) *Attorney, Agent, or Firm*—McDermott Will & Emery LLP

(57) ABSTRACT

A wiring structure including a transmission line structure capable of simplifying a manufacturing process is obtained. This wiring structure comprises a first trench formed on a first insulator film provided on a substrate, a first wire formed in the extensional direction of the first trench along at least part of the inner surface of the first trench and a second wire formed to be opposed to the first wire through a second insulator film for forming a transmission line for transmitting signals with the first wire. The first wire, the second insulator film and the second wire are embedded in the first trench. This wiring structure is manufactured through a single lithography step, a single etching step and a single resist removing step for forming the first trench and a single CMP step, whereby the manufacturing process is simplified.

5 Claims, 7 Drawing Sheets

WIRING STRUCTURE AND MANUFACTURING METHOD THEREFOR, SEMICONDUCTOR DEVICE INCLUDING WIRING STRUCTURE AND WIRING BOARD

BACKGROUND OF THE INVENTION

1. Field of the Invention

The present invention relates to a wiring structure and a manufacturing method therefor, a semiconductor device including the wiring structure and a wiring board, and more specifically, it relates to a wiring structure serving as a transmission line for transmitting signals and a manufacturing method therefor, a semiconductor device including the wiring structure and a wiring board.

2. Description of the Background Art

Following the recent shrinkage of design rule of semiconductor devices, the frequencies of signals have approached to the gigahertz (GHz) band, partially exceeding 1 GHz. When the frequency of a signal reaches the GHz band, it is difficult to handle a signal wire as a lumped constant circuit generally employed for designing a semiconductor device and hence the signal wire must be handled as a distributed constant circuit. The term "lumped constant circuit" indicates a circuit handling inductors, resistors etc. as those present on some limited positions thereof with definite sizes. The term "distributed constant circuit" indicates a circuit handling inductors, resistors etc. per unit length of a line as those uniformly distributed over the entire line. In this distributed constant circuit, a path transmitting signals is referred to as a transmission line. This transmission line serves as a line transmitting electromagnetic waves.

In general, a wire in a chip of a semiconductor device is handled as a lumped constant circuit due to a small wiring length. Therefore, no transmission line structure is employed in the chip of the semiconductor device. A wiring board mounted with the semiconductor device generally already employs a transmission line due to a large wiring length (refer to Japanese Patent Laying-Open No. 2002-158227, for example).

FIGS. 12 to 15 are sectional views showing exemplary conventional transmission line structures. FIG. 12 shows a stripline structure including a signal wire 102 embedded in an insulator film 103 and shield wires (ground wires) 101 and 104 formed on the lower and upper surfaces of the insulator film 103 respectively. FIG. 13 shows a microstripline structure including a shield wire (ground wire) 111 formed on a surface of an insulator film 113 and a signal wire 112 formed on another surface of the insulator film 113. FIG. 14 shows a stacked pair line structure including a signal wire 121 and a shield wire (ground wire) 122, identical in width and thickness to each other, formed on both surfaces of an insulator film 123 respectively.

FIG. 15 shows a coaxial cable comprising a signal wire 131 and a shield wire (ground wire) 132 formed to enclose the signal wire 131 through an insulator 133.

As hereinabove described, the wiring board for mounting the conventional semiconductor device employs any of the transmission lines shown in FIGS. 12 to 15.

On the other hand, a wire in the chip of the semiconductor device must also be handled as a transmission line when the signal frequency reaches the GHz band. In order to form a transmission line structure having the stripline structure shown in FIG. 12, for example, a patterning step including lithography, etching and resist removal must be carried out three times in total for forming the shield wires 101 and 104 and the signal wire 102. Therefore, the manufacturing process is complicated and the manufacturing cost is increased. Also when the structure shown in FIG. 13 or 14 is formed as the wire in the chip of the semiconductor device, the patterning step including lithography, etching and resist removal must be carried out twice, to disadvantageously complicate the manufacturing process and increase the manufacturing cost.

In each of the transmission line structures shown in FIGS. 12 to 14 employed in the aforementioned wiring board for mounting the semiconductor device, a shielding effect with the shield wire(s) 101 and 104, 111 or 122 is so insufficient that signal transmission is easily externally influenced following increase of the signal frequency. Therefore, it is difficult to sufficiently suppress the so-called crosstalk, i.e., such a phenomenon that a signal of a signal system leaks into a signal of another signal system.

SUMMARY OF THE INVENTION

An object of the present invention is to provide a wiring structure including a transmission line structure capable of simplifying a manufacturing process and a manufacturing method therefor, a semiconductor device comprising the wiring structure and a wiring board.

Another object of the present invention is to obtain a highly reliable transmission line having a high shielding effect in the aforementioned wiring structure and the manufacturing method therefor, the semiconductor device comprising the wiring structure and the wiring board.

A wiring structure according to a first aspect of the present invention comprises a first trench formed on a first insulator film provided on a substrate, a first wire formed in the extensional direction of the first trench along at least part of the inner surface of the first trench and a second wire formed to be opposed to the first wire through a second insulator film for forming a transmission line for transmitting signals with the first wire, while the first wire, the second insulator film and the second wire are embedded in the first trench.

In the wiring structure according to the first aspect, the first and second wires formed through the second insulator film are embedded in the first trench of the first insulator film as hereinabove described, thereby forming a transmission line structure embedded in the single first insulator film. This transmission line structure can be obtained through only a single lithography step, a single etching step and a single resist removing step for forming the first trench, whereby the manufacturing process can be simplified and the manufacturing cost can be reduced.

In the aforementioned wiring structure according to the first aspect, the first wire is preferably formed to cover substantially the overall inner surface of the first trench along the inner surface of the first trench, and the second wire formed to be opposed to the first wire through the second insulator film is preferably so formed that the first wire encloses the surface opposed to the first wire. According to this structure, a structure having a high shielding effect through the first wire can be obtained when the second wire is used as a signal wire. Thus, signal transmission through the second wire is so hardly externally influenced that a high-frequency signal exceeding the gigahertz band can also be transmitted while suppressing a crosstalk. Consequently, the wiring structure can be used as a reliable transmission line.

In this case, the first wire preferably includes a shield wire, and the second wire preferably includes a signal wire. According to this structure, the effect of shielding the second wire serving as the signal wire with the first wire serving as the shield wire enclosing the second wire can be improved.

In the aforementioned wiring structure having the first wire enclosing the second wire, the first trench may have a trapezoidal shape upwardly increased in width. According to this structure, a corner of the bottom of the first trench has an obtuse angle, whereby field concentration can be relaxed as compared with a rectangular first trench. In the aforementioned wiring structure having the first wire enclosing the second wire, a corner of the bottom of the first trench may have a circular shape. According to this structure, the first and second wires can be formed in shapes having no angular portions. Thus, field concentration can be suppressed thereby inhibiting the first and second wires from a leakage current or dielectric breakdown. Consequently, superior transmission line characteristics can be implemented.

In the aforementioned wiring structure having the first wire enclosing the second wire, the first trench may have an arcuate shape upwardly increased in width. According to this structure, the inner surface of the first trench entirely has a circular shape, whereby the first and second wires can be formed in shapes having no angular portions. Thus, field concentration can be suppressed thereby inhibiting the first and second wires from a leakage current or dielectric breakdown. Consequently, superior transmission line characteristics can be implemented. In this case, the first trench may have a substantially semicircular shape.

In the aforementioned wiring structure according to the first aspect, the first trench may be rectangularly formed, the first wire may be formed on the bottom surface of the first trench to have a substantially flat upper surface, and the second wire formed to be opposed to the first wire through the second insulator film may have a smaller width than the first wire. According to this structure, a microstripline structure can be embedded in the first trench.

The aforementioned wiring structure according to the first aspect preferably further comprises a second trench formed on the first insulator film provided on the substrate at a prescribed interval from the first trench and a third wire formed to fill up the second trench. According to this structure, the third wire can be used as an ordinary wire while using the first and second wires as transmission lines. In this case, the third wire and the first wire preferably consist of layers formed through the same process. According to this structure, the third and first wires can be simultaneously formed, thereby further simplifying the manufacturing process. Thus, the manufacturing cost can be further reduced.

A semiconductor device including a wiring structure according to a second aspect of the present invention includes a wiring structure including a first trench formed on a first insulator film provided on a substrate, a first wire formed in the extensional direction of the first trench along at least part of the inner surface of the first trench and a second wire formed to be opposed to the first wire through a second insulator film, while the first wire, the second insulator film and the second wire are embedded in the first trench.

In the semiconductor device including a wiring structure according to the second aspect, a transmission line structure embedded in a single first insulator film can be formed by embedding the first and second wires formed through the second insulator film in the first trench of the first insulator film as hereinabove described. Therefore, the transmission line structure can be easily formed without influencing other layers provided on the semiconductor substrate. Thus, the wires in the semiconductor device can be easily used as transmission lines capable of withstanding transmission of high-frequency signals, while the wires can be designed with a high degree of freedom. Further, the transmission line structure embedded in the single first insulator film can be easily formed through a process of forming wires of a conventional semiconductor device due to the aforementioned wiring structure. This transmission line structure requires only a single lithography step, a single etching step and a single resist removing step for forming the first trench, whereby the process of fabricating the semiconductor device can be simplified and the fabrication cost for the semiconductor device can be reduced.

In the aforementioned semiconductor device including a wiring structure according to the second aspect, the first wire is preferably formed to cover substantially the overall inner surface of the first trench along the inner surface of the first trench, and the second wire formed to be opposed to the first wire through the second insulator film is preferably so formed that the first wire encloses the surface opposed to the first wire. According to this structure, a structure having a high shielding effect through the first wire can be obtained when the second wire is used as a signal wire. Thus, signal transmission through the second wire is so hardly externally influenced that a high-frequency signal exceeding the gigahertz band can also be transmitted while suppressing a crosstalk. Consequently, the wiring structure can be used as a reliable transmission line.

A wiring board including a wiring structure according to a third aspect of the present invention includes a wiring structure including a first trench formed on a first insulator film provided on a substrate, a first wire formed in the extensional direction of the first trench along at least part of the inner surface of the first trench and a second wire formed to be opposed to the first wire through a second insulator film, while the first wire, the second insulator film and the second wire are embedded in the first trench.

In the wiring board including a wiring structure according to the third aspect, the first and second wires formed through the second insulator film are embedded in the first trench of the first insulator film as hereinabove described, thereby forming a transmission line structure embedded in the single first insulator film. This transmission line structure can be obtained through only a single lithography step, a single etching step and a single resist removing step for forming the first trench, whereby the manufacturing process for the wiring board can be simplified and the manufacturing cost therefor can be reduced.

In the aforementioned wiring board including a wiring structure according to the third aspect, the first wire is preferably formed to cover substantially the overall inner surface of the first trench along the inner surface of the first trench, and the second wire formed to be opposed to the first wire through the second insulator film is preferably so formed that the first wire encloses the surface opposed to the first wire. According to this structure, a structure having a high shielding effect through the first wire can be obtained when the second wire is used as a signal wire. Thus, signal transmission through the second wire is so hardly externally influenced that a high-frequency signal exceeding the gigahertz band can also be transmitted while suppressing a crosstalk. Consequently, the wiring structure can be used as a reliable transmission line.

A method of manufacturing a wiring structure according to a fourth aspect of the present invention comprises steps of forming a first trench on the surface of a first insulator film formed on a substrate, forming a first conductor film for defining a first wire in the first trench and on the first insulator film, forming a second insulator film on the first conductor film, forming a second conductor film for defining a second wire on the second insulator film and removing portions of the first conductor film, the second insulator film and the second conductor film formed on regions other than the inner part of the first trench thereby forming the first wire, the second insulator film and the second wire respectively.

In the method of manufacturing a wiring structure according to the fourth aspect, the first conductor film, the second insulator film and the second conductor film are formed in the first trench and on the first insulator film and thereafter the portions of these films formed on the regions other than the inner part of the first trench are removed as hereinabove described, whereby a transmission line structure embedded in the single first insulator film can be formed through a simple process. The method of manufacturing a wiring structure requires only a single lithography step, a single etching step and a single resist removing step for forming the first trench, whereby the manufacturing process can be simplified and the manufacturing cost can be reduced.

In the aforementioned method of manufacturing a wiring structure according to the fourth aspect, the step of forming the first wire, the second insulator film and the second wire preferably includes a step of deciding the width and the depth of the first trench as well as the thicknesses of and the materials for the first conductor film, the second insulator film and the second conductor film so that the second conductor film remains on the center of the surface of the first trench with a prescribed thickness and a prescribed line width while the first conductor film encloses the second conductor film with a prescribed electric characteristic in the first trench. According to this structure, a wiring structure including a transmission line having a desired electric characteristic such as characteristic impedance can be easily formed.

The aforementioned method of manufacturing a wiring structure according to the fourth aspect preferably forms at least either the first conductor film or the second conductor film by either electrolytic plating or electroless plating. According to this structure, at least either the first conductor film or the second conductor film can be formed in a desired shape with a desired thickness.

In the aforementioned method of manufacturing a wiring structure according to the fourth aspect, the step of forming the first wire, the second insulator film and the second wire preferably includes a step of removing the portions of the first conductor film, the second insulator film and the second conductor film formed on the regions other than the inner part of the first trench by chemical mechanical polishing (CMP) thereby forming the first wire, the second insulator film and the second wire. According to this structure, the upper surface of the wiring structure can be excellently flattened when removing the portions of the first conductor film, the second insulator film and the second conductor film formed on the regions other than the inner part of the first trench. Consequently, a wiring structure having excellent flatness can be easily formed. Further, the wiring structure can be formed through a single lithography step, a single etching step and a single resist removing step as well as a single CMP step, whereby the manufacturing process can be simplified and the manufacturing cost can be reduced as compared with a conventional manufacturing process requiring at least two lithography steps, at least two etching steps and at least two resist removing steps.

In the aforementioned method of manufacturing a wiring structure forming the first wire to enclose the second wire, the first wire preferably includes a shield wire, and the second wire preferably includes a signal wire. According to this structure, the effect of shielding the second wire serving as the signal wire with the first wire serving as the shield wire enclosing the same can be improved. Thus, signal transmission through the second wire is so hardly externally influenced that a high-frequency signal exceeding the gigahertz band can also be transmitted while suppressing a crosstalk. Consequently, the wiring structure can be used as a reliable transmission line.

In the aforementioned method of manufacturing a wiring structure forming the first wire to enclose the second wire, the first trench may have a trapezoidal shape upwardly increased in width. According to this structure, corner of the bottom of the first trench has an obtuse angle, whereby field concentration can be relaxed as compared with a rectangular first trench. In the aforementioned method of manufacturing a wiring structure forming the first wire to enclose the second wire, a corner of the bottom of the first trench may have a circular shape. According to this structure, field concentration can be suppressed on the corner of the bottom of the first trench. Thus, the first and second wires can be inhibited from a leakage current or dielectric breakdown, thereby implementing superior transmission line characteristics.

In the aforementioned method of manufacturing a wiring structure forming the first wire to enclose the second wire, the first trench may have an arcuate shape upwardly increased in width. According to this structure, the first wire has no angular portion on the inner surface thereof, whereby field concentration can be suppressed. Thus, the first and second wires can be inhibited from a leakage current or dielectric breakdown, thereby implementing superior transmission line characteristics. In this case, the first trench may have a substantially semicircular shape.

The aforementioned method of manufacturing a wiring structure according to the fourth aspect preferably rectangularly forms the first trench, forms the first wire on the bottom surface of the first trench to have a substantially flat upper surface, and forms the second wire opposed to the first wire through the second insulator film to have a smaller width than the first wire. According to this structure, a microstripline structure can be embedded in the first trench.

The aforementioned method of manufacturing a wiring structure according to the fourth aspect preferably further comprises steps of forming a second trench on the first insulator film provided on the substrate at a prescribed interval from the first trench and forming a third wire to fill up the second trench. According to this structure, the third wire can be used as an ordinary wire while using the first and second wires as transmission lines. In this case, the step of forming the third wire preferably includes a step of filling up the second trench with the first conductor film for defining the first wire thereby forming the third wire. According to this structure, the third wire and the first wire can be formed at the same time, whereby the manufacturing process can be further simplified. Thus, the manufacturing cost can be further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
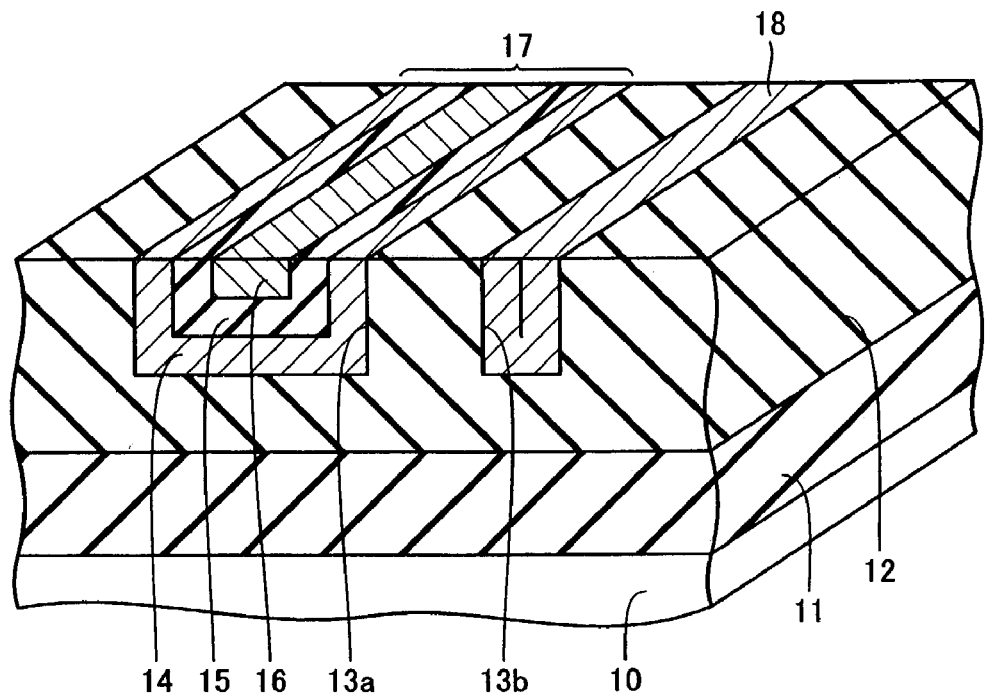
FIG. 1 is a perspective view showing a semiconductor device including a wiring structure according to a first embodiment of the present invention.

The structure of a semiconductor device including a wiring structure according to a first embodiment of the present invention is described with reference to FIG. 1. In the semiconductor device according to the first embodiment, an underlayer 11 consisting of an $SiO_2$ film is formed on a semiconductor substrate 10, as shown in FIG. 1. An insulator film 12 having a thickness of about 2 μm to about 20 μm is formed on the underlayer 11. The insulator film 12 is an example of the "first insulator film" in the present invention.

According to the first embodiment, rectangular trenches 13a and 13b are formed on the surface of the insulator film 12 at a prescribed interval. The trench 13a has a width of about 1 μm to about 10 μm and a depth of about 1 μm to about 10 μm. The trench 13b is smaller in width than and identical in depth to the trench 13a. An outer wire 14 of copper, an insulator film 15 consisting of an $SiO_2$ film and an inner wire 16 of copper are embedded in the trench 13a. More specifically, the outer wire 14 is concavely formed along the bottom surface and the side surfaces of the rectangular trench 13a. The insulator film 15 is concavely formed along the inner surfaces of the outer wire 14. The inner wire 16 is formed to fill up a recess portion of the insulator film 15.

The trench 13a is an example of the "first trench" in the present invention, and the trench 13b is an example of the "second trench" in the present invention. The outer wire 14 is an example of the "first wire" in the present invention, and the insulator film 15 is an example of the "second insulator film" in the present invention. The inner wire 16 is an example of the "second wire" in the present invention.

The outer wire 14 is formed to enclose the bottom surface and both side surfaces of the inner wire 16. The outer wire 14 serves as a shield wire, and the inner wire 16 serves as a signal wire. The inner and outer wires 16 and 14 form a wire pair 17 serving as a transmission line.

The trench 13b is filled up with a single wire 18 formed by the same conductive layer as the outer wire 14 embedded in the trench 13a. The single wire 18 serves not as a transmission line but as an ordinary interconnection layer. The single wire 18 is an example of the "third wire" in the present invention.

In the semiconductor device according to the first embodiment, the inner and outer wires 16 and 14 formed through the insulator film 15 are embedded in the trench 13a of the insulator film 12 as hereinabove described, whereby a transmission line structure can be embedded in the single insulator film 12. According to this transmission line structure, the wiring structure can be formed through a single lithography step, a single etching step and a single resist removing step for forming the trench 13a as well as a single CMP step, whereby the manufacturing process can be simplified and the manufacturing cost can be reduced as compared with a conventional manufacturing process requiring at least two lithography steps, at least two etching steps and at least resist removing steps.

According to the first embodiment, an effect of shielding the inner wire 16 serving as the signal wire can be improved by forming the outer wire 14 to enclose not only the bottom surface but also both side surfaces of the inner wire 16. In other words, a structure similar to that of the lower half of a coaxial cable can be obtained according to the first embodiment. Thus, signal transmission through the inner wire 16 is hardly externally influenced, whereby a high-frequency signal exceeding the gigahertz band can also be transmitted while suppressing a crosstalk. Consequently, the wiring structure can be used as a reliable transmission line.

According to the first embodiment, further, the transmission line structure embedded in the single insulator film 12 can be easily formed without influencing the remaining layers formed on the semiconductor substrate 10. Consequently, any wire in the semiconductor device can be easily used as a transmission line capable of withstanding transmission of high-frequency signals, while enabling wire design with a high degree of freedom.

According to the first embodiment, the outer wire 14 provided in the trench 13a and the single wire 18 provided in the trench 13b are formed by the same conductive layer, so that the outer wire 14 and the single wire 18 can be simultaneously formed in the manufacturing process as described later, whereby the manufacturing process can be further simplified. Thus, the manufacturing cost can be further reduced.

The manufacturing process for the semiconductor device including a wiring structure according to the first embodiment shown in FIG. 1 is now described with reference to FIGS. 2 to 6.

Figure 2:
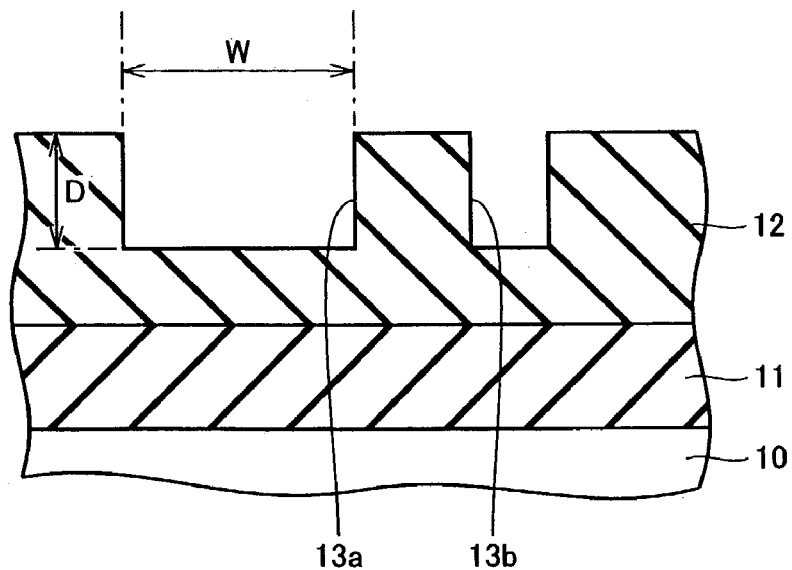
FIGS. 2 to 6 are sectional views for illustrating a process of fabricating the semiconductor device including a wiring structure according to the first embodiment shown in FIG. 1.

First, the underlayer 11 is formed on the semiconductor substrate 10, as shown in FIG. 2. The insulator film 12 is formed on the underlayer 11 with the thickness of about 2 μm to about 20 μm. Thereafter the trenches 13a and 13b are formed on the surface of the insulator film 12 through general lithography and dry etching. The trench 13a has an opening width W of about 1 μm to about 10 μm and a depth D of about 1 μm to about 10 μm. In this case, the depth D of the trench 13a is so set as not to exceed the thickness of the insulator film 12. The trench 13b is formed to be identical in depth to and smaller in opening width than the trench 13a.

Figure 3:
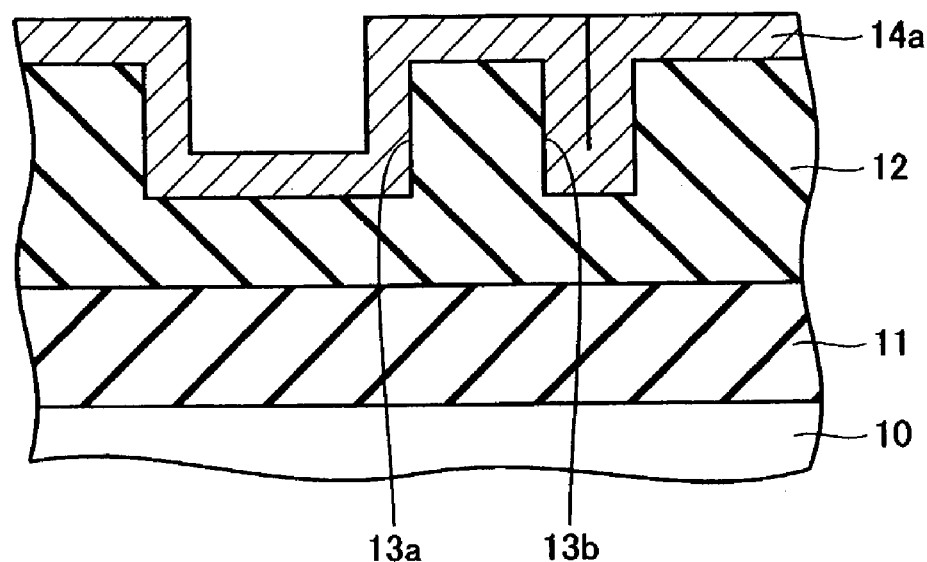

Then, an outer wire film 14a of copper is formed in the trenches 13a and 13b of the insulator film 12 and on the upper surface of the insulator film 12 by electrolytic or electroless plating, as shown in FIG. 3. The thickness of the outer wire film 14a is so set as not to exceed the depth D of the trenches 13a and 13b. Further, the thickness of the outer wire film 14a is so set that the outer wire film 14a completely fills up the trench 13b having the small opening width. The outer wire film 14a is an example of the "first conductor film" in the present invention.

Figure 4:
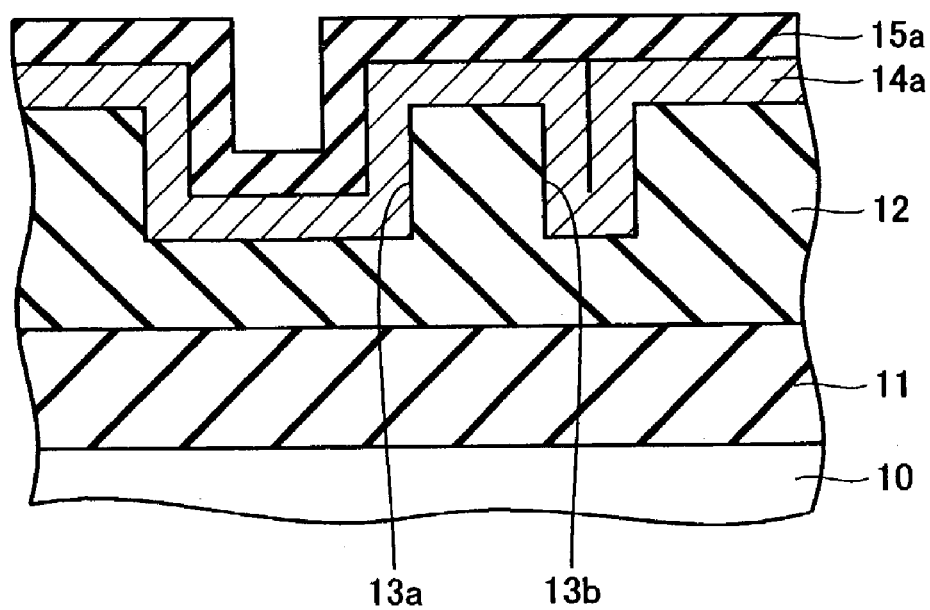

Then, an insulator film 15a consisting of an SiO₂ film is formed on the upper surface of the outer wire film 14a, as shown in FIG. 4. The thickness of the insulator film 15a is so set that the trench 13a is not completely filled up with the insulator film 15a.

Figure 5:
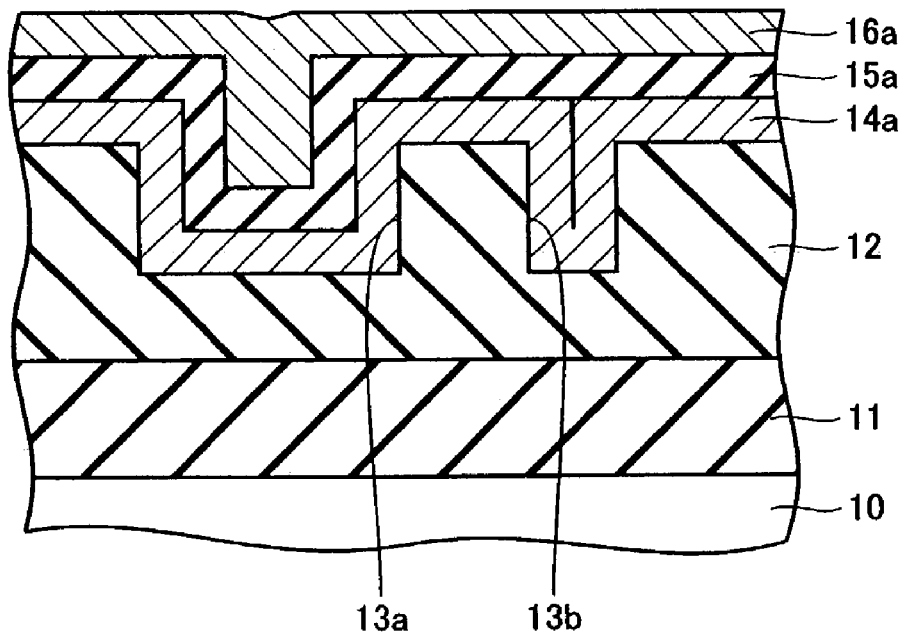

Then, an inner wire film 16a of copper is formed on the upper surface of the insulator film 15a by electrolytic or electroless plating, as shown in FIG. 5. Thus, the trench 13a is filled up with the outer wire film 14a, the insulator film 15a and the inner wire film 16a. The inner wire film 16a is an example of the "second conductor film" in the present invention.

Figure 6:
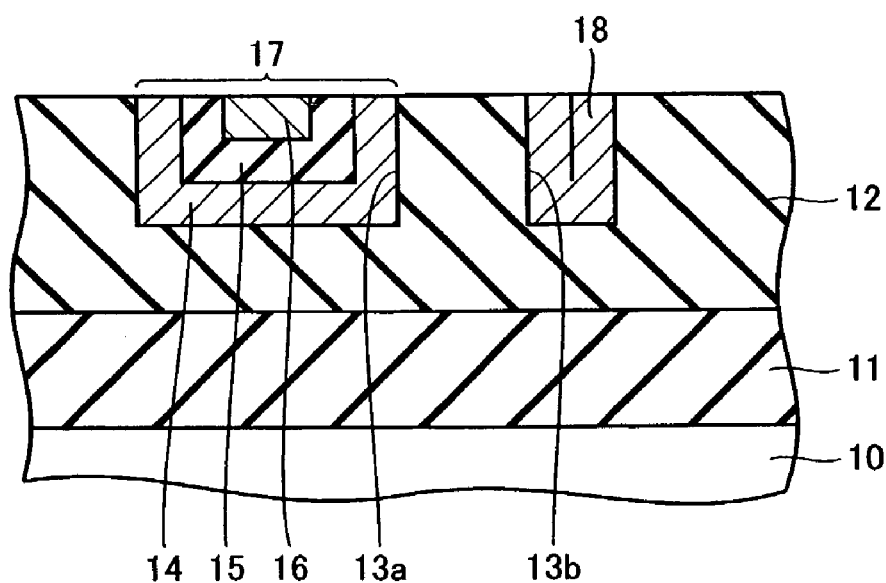

Thereafter portions of the outer wire film 14a, the insulator film 15a and the inner wire film 16a other than the regions formed in the trench 13a are removed by CMP. Thus, the trench 13a is filled up with the outer wire 14, the insulator film 15 and the inner wire 16 having flat upper surfaces, as shown in FIG. 6. The trench 13b is filled up with the single wire 18 consisting of the outer wire film 14a (see FIG. 5).

In the manufacturing process according to the first embodiment, electric characteristics such as characteristic impedance, for example, of the wire pair 17 can be easily and precisely set by properly adjusting the opening width W and the depth D of the trench 13a as well as the thicknesses of and the materials for the outer wire film 14a, the insulator film 15a and the inner wire film 16a deposited in the trench 13a.

In the manufacturing process according to the first embodiment, further, the inner and outer wire films 16a and 14a are formed by electrolytic or electroless plating as hereinabove described, whereby the inner and outer wire films 16a and 14a can be formed in desired shapes with desired thicknesses.

In the manufacturing process according to the first embodiment, in addition, the insulator film 12 can be excellently flattened by polishing the outer wire film 14a, the insulator film 15a and the inner wire film 16a by CMP thereby flattening the same. Consequently, a wiring structure having excellent flatness can be easily obtained.

Figure 7:
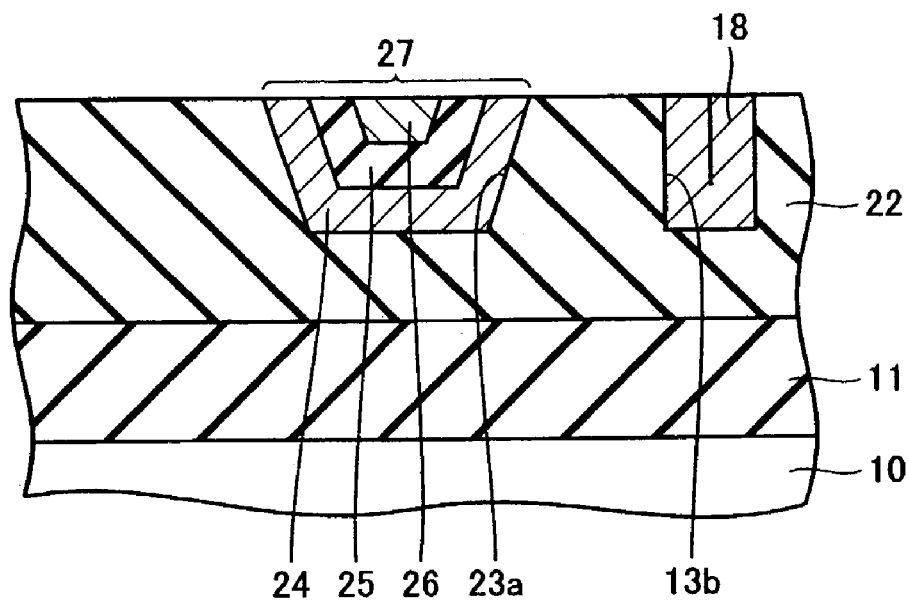
FIG. 7 is a sectional view showing a semiconductor device including a wiring structure according to a first modification of the first embodiment shown in FIG. 1.

First to fourth modifications of the semiconductor device including a wiring structure according to the first embodiment are now described with reference to FIGS. 7 to 10 respectively. Referring to FIG. 7, a trapezoidal trench 23a having an upwardly increased width and a rectangular trench 13b similar to the trench 13b according to the first embodiment are formed on the surface of an insulator film 22 provided on an underlayer 11 in the first modification of the first embodiment. According to the first modification of the first embodiment, an outer wire 24 is concavely formed along the inner surfaces of the trapezoidal trench 23a. An insulator film 25 is concavely formed along the inner surfaces of the outer wire 24. An inner wire 26 is formed to fill up the concave portion of the insulator film 25. The inner wire 26 has a trapezoidal sectional shape upwardly increased in width. The trapezoidal trench 23a can be easily formed through dry etching.

The insulator film 22 is an example of the "first insulator film" in the present invention, and the trench 23a is an example of the "first trench" in the present invention. The outer wire 24 is an example of the "first wire" in the present invention, and the insulator film 25 is an example of the "second insulator film" in the present invention. The inner wire 26 is an example of the "second wire" in the present invention. The inner and outer wires 26 and 24 form a wire pair 27 serving as a transmission line. The inner wire 26 serves as a signal wire, and the outer wire 24 serves as a shield wire. Corners of the bottom of the trench 23a have an obtuse angle due to the trapezoidal shape, whereby field concentration can be relaxed as compared with a rectangular trench. The remaining effect of the first modification of the first embodiment is similar to that of the aforementioned first embodiment.

Figure 8:
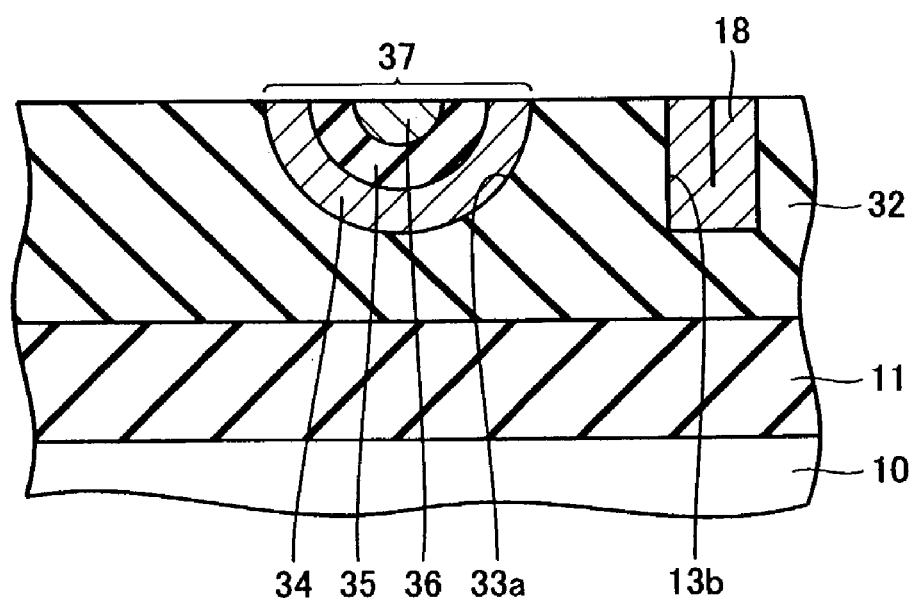
FIG. 8 is a sectional view showing a semiconductor device including a wiring structure according to a second modification of the first embodiment shown in FIG. 1.

Referring to FIG. 8, an arcuate (semicircular) trench 33a and a rectangular trench 13b similar to that in the first embodiment are formed on the surface of an insulator film 32 provided on an underlayer 11 in the second modification of the first embodiment. An outer wire 34 is concavely formed along the inner surface of the semicircular trench 33a. An insulator film 35 is concavely formed along the inner surface of the outer wire 34. A semicircular inner wire 36 is formed to fill up the concave portion of the insulator film 35. The inner and outer wires 36 and 34 form a wire pair 37. The inner wire 36 serves as a signal wire, and the outer wire 34 serves as a shield wire.

The insulator film 32 is an example of the "first insulator film" in the present invention, and the trench 33a is an example of the "first trench" in the present invention. The outer wire 34 is an example of the "first wire" in the present invention, and the insulator film 35 is an example of the "second insulator film" in the present invention. The inner wire 36 is an example of the "second wire" in the present invention.

According to the second modification of the first embodiment, the trench 33a is so semicircularly formed that the inner surface thereof is entirely circular, whereby the inner and outer wires 36 and 34 can be formed in shapes having no angular portions. Thus, field concentration can be suppressed. Consequently, the inner and outer wires 36 and 34 can be inhibited from a leakage current or dielectric breakdown, thereby implementing superior transmission line characteristics. The remaining effect of the second modification of the first embodiment is similar to that of the aforementioned first embodiment.

Figure 9:
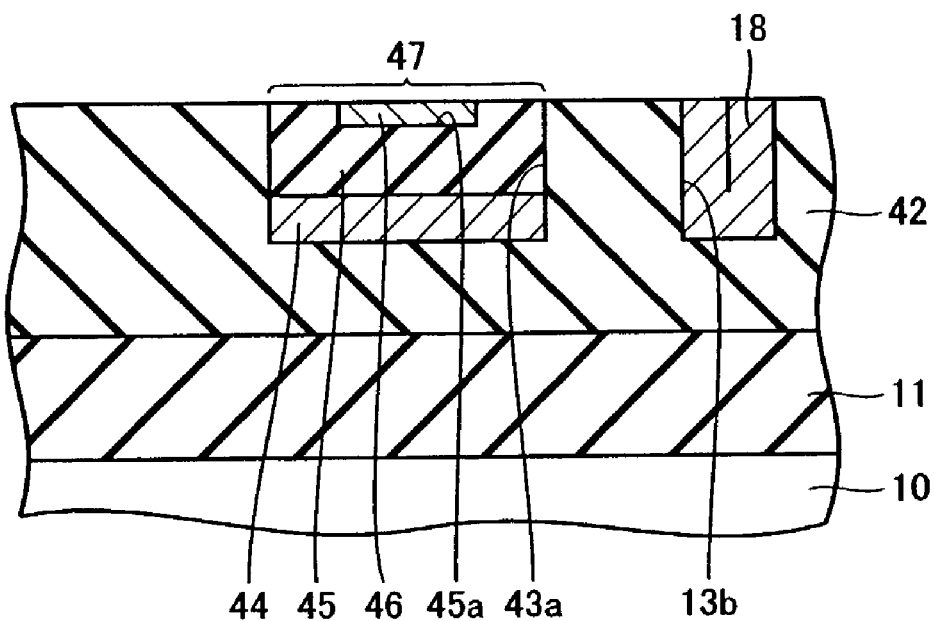
FIG. 9 is a sectional view showing a semiconductor device including a wiring structure according to a third modification of the first embodiment shown in FIG. 1.

Referring to FIG. 9, a rectangular trench 43a and a rectangular trench 13b similar to that in the first embodiment are formed on the surface of an insulator film 42 provided on an underlayer 11 in the third modification of the first embodiment. An outer wire 44 is formed on the overall bottom surface of the trench 43a to have a flat upper surface. An insulator film 45 is formed on the outer wire 44 to have a recess portion 45a. An inner wire 46 is formed to fill up the recess portion 45a of the insulator film 45. The inner and outer wires 46 and 44 form a wire pair 47 serving as a transmission line. The inner wire 46 serves as a signal wire, and the outer wire 44 serves as a shield wire. The inner wire 46 is formed with a smaller width than the outer wire 44. Alternatively, the inner and outer wires 46 and 44 may be substantially identical in width to each other.

The insulator film 42 is an example of the "first insulator film" in the present invention, and the trench 43a is an example of the "first trench" in the present invention. The outer wire 44 is an example of the "first wire" in the present invention, and the insulator film 45 is an example of the "second insulator film" in the present invention. The inner wire 46 is an example of the "second wire" in the present invention.

Figure 13:
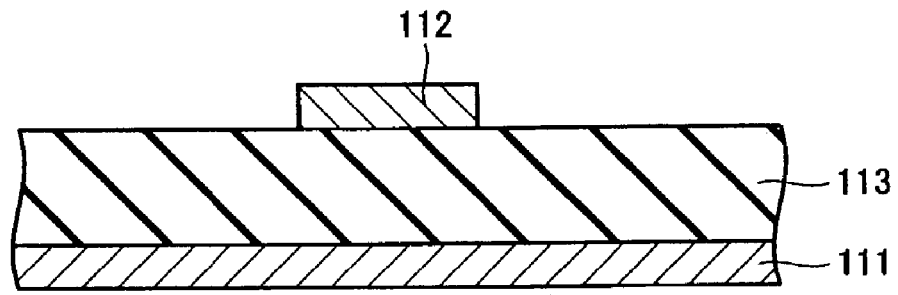
FIG. 13 is a sectional view showing a microstripline structure employed for the conventional wiring board.
Figure 14:
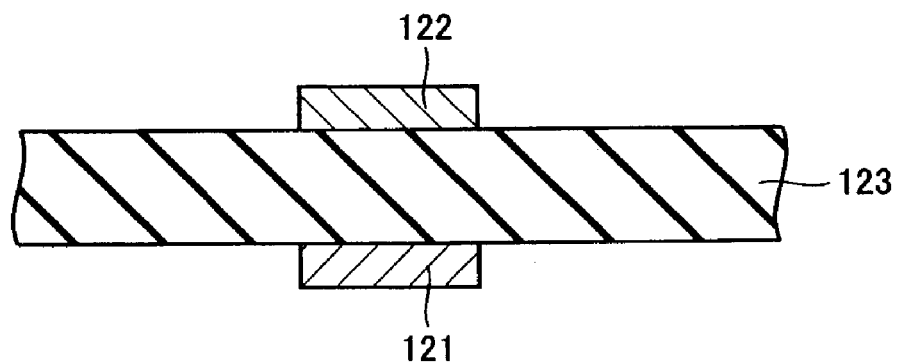
FIG. 14 is a sectional view showing a stacked pair line structure employed for the conventional wiring board.
Figure 15:
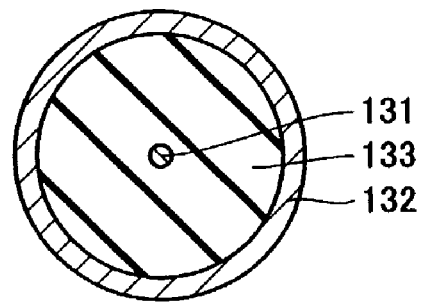
FIG. 15 is a sectional view showing a conventional coaxial cable.

According to the third modification of the first embodiment, the microstripline structure shown in FIG. 13 can be embedded in the trench 43a of the insulator film 42. The remaining effect of the third modification of the first embodiment is similar to that of the aforementioned first embodiment.

Figure 10:
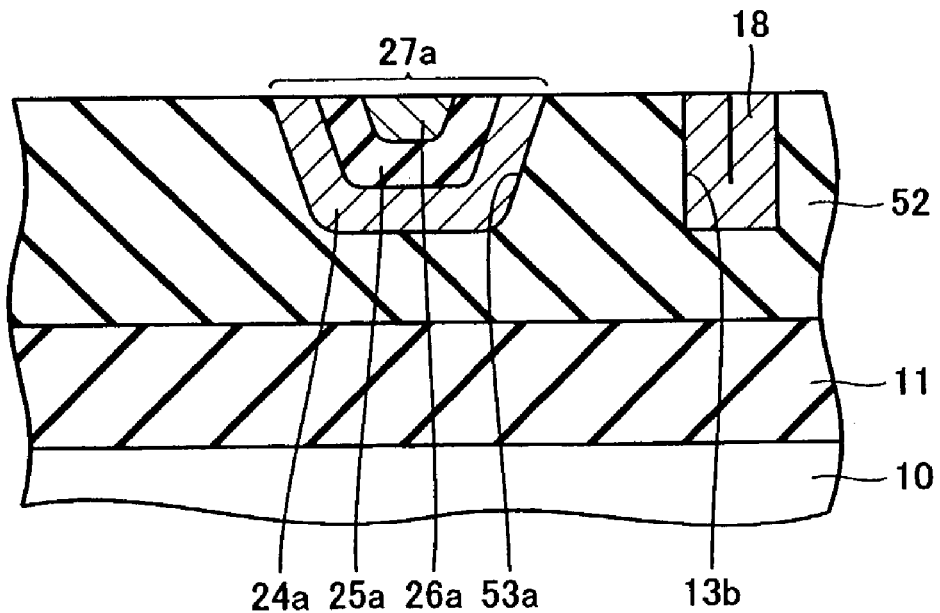
FIG. 10 is a sectional view showing a semiconductor device including a wiring structure according to a fourth modification of the first embodiment shown in FIG. 1.

Referring to FIG. 10, the fourth modification of the first embodiment is described with reference to a structure obtained by eliminating angular portions from the corners of the bottom of the trench 23b in the first modification of the first embodiment shown in FIG. 7. More specifically, a trapezoidal trench 53a having circular corners on its bottom surface and a rectangular trench 13b similar to that in the first embodiment are formed on the surface of an insulator film 52 provided on an underlayer 11 in the fourth modification of the first embodiment. An outer wire 24a having rounded corners is concavely formed along the inner surfaces of the trench 53a. An insulator film 25a having rounded corners is concavely formed along the inner surfaces of the trench 53a. An insulator film 25a is concavely formed along the inner surfaces of the outer wire 24a. A trapezoidal inner wire 26a having rounded corners is formed to fill up the concave portion of the insulator film 25a. The inner and outer wires 26a and 24a form a wire pair 27a serving as a transmission line. The inner wire 26a serves as a signal wire, and the outer wire 24a serves as a shield wire.

The insulator film 52 is an example of the "first insulator film" in the present invention, and the trench 53a is an example of the "first trench" in the present invention. The outer wire 24a is an example of the "first wire" in the present invention, and the insulator film 25a is an example of the "second insulator film" in the present invention. The inner wire 26a is an example of the "second wire" in the present invention.

According to the fourth modification of the first embodiment, the trench 53a is provided in the form of a trapezoid having circular bottom corners so that the inner and outer wires 26a and 24a have no angular portions, whereby field concentration can be suppressed. Thus, the inner and outer wires 26a and 24a can be inhibited from a leakage current or dielectric breakdown, thereby implementing superior transmission line characteristics.

The trapezoidal trench 23a having the rounded bottom corners according to the fourth modification of the first embodiment shown in FIG. 10 can be easily formed through wet etching.

(Second Embodiment)

A second embodiment of the present invention is now described with reference to FIG. 11. In the second embodiment, the present invention is applied to a wiring board 61 for mounting an integrated circuit device (semiconductor device), dissimilarly to the aforementioned first embodiment.

According to the second embodiment, an insulator film 62 is formed on the wiring board 61. Rectangular trenches 63a and 63b are formed on the surface of the insulator film 62. The trenches 63a and 63b are similar in dimension and shape to the trenches 13a and 13b of the semiconductor device according to the first embodiment shown in FIG. 1 respectively. An outer wire 64 is concavely formed along the inner surfaces of the rectangular trench 63a. An insulator film 65 is concavely formed along the inner surfaces of the outer wire 64. An inner wire 66 is formed to fill up the concave portion of the insulator film 65. The inner and outer wires 66 and 64 form a wire pair 67 serving as a transmission line. The inner wire 66 serves as a signal wire, and the outer wire 64 serves as a shield wire.

The insulator film 62 is an example of the "first insulator film" in the present invention, and the trench 63a is an example of the "first trench" in the present invention. The trench 63b is an example of the "second trench" in the present invention. The outer wire 64 is an example of the "first wire" in the present invention, and the insulator film 65 is an example of the "second insulator film" in the present invention. The inner wire 66 is an example of the "second wire" in the present invention. The trench 63b is filled up with a single wire 68 formed by the same conductive layer as the outer wire 64. The single wire 68 is an example of the "third wire" in the present invention.

A manufacturing process for a wiring structure according to the second embodiment is similar to the manufacturing process for the wiring structure according to the first embodiment shown in FIGS. 2 to 6.

According to the second embodiment, the trench 63a is formed on the surface of the insulator film 62 provided on the wiring board 61 while a transmission line structure consisting of the outer wire 64, the insulator film 65 and the inner wire 66 is embedded in the trench 63a as hereinabove described, whereby the transmission line structure embedded in the single insulator film 62 can be easily formed on the wiring board 61. According to this transmission line structure, the wiring structure can be formed through a single lithography step, a single etching step and a single resist removing step for forming the trench 63a as well as a single CMP step, whereby the manufacturing process for the wiring board 61 can be simplified and the manufacturing cost therefor can be reduced as compared with a conventional manufacturing process requiring at least two lithography steps, at least two etching steps and at least two resist removing steps.

Also according to the second embodiment, desired electric characteristics such as characteristic impedance can be obtained for the wiring board 61 by properly setting the width and the depth of the trench 63a as well as the thicknesses of and the materials for the outer wire 64, the insulator film 65 and the inner wire 66, similarly to the aforementioned first embodiment.

According to the second embodiment, further, the outer wire 64 is formed to enclose not only the bottom surface but also both side surfaces of the inner wire 66, whereby an effect of shielding the inner wire 66 serving as the signal wire can be improved. Thus, signal transmission through the inner wire 66 is so hardly externally influenced that a high-frequency signal exceeding the gigahertz band can also be transmitted while suppressing a crosstalk. Consequently, the wiring board 61 can include a highly reliable transmission line.

According to the second embodiment, in addition, the outer wire 64 provided in the trench 63a and the single wire 68 provided in the trench 63b are formed by the same conductive layer so that the outer wire 64 and the single wire 68 can be formed at the same time, whereby the manufacturing process can be simplified. Thus, the manufacturing cost can be further reduced.

The remaining effect of the second embodiment is similar to that of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the inner wire film 16a and the inter wire film 14a are formed by electrolytic or electroless plating in the aforementioned first embodiment, the present invention is not restricted to this but the inner and outer wire films 16a and 14a may alternatively be formed by sputtering, CVD or a combination of a plurality of film forming methods.

Figure 11:
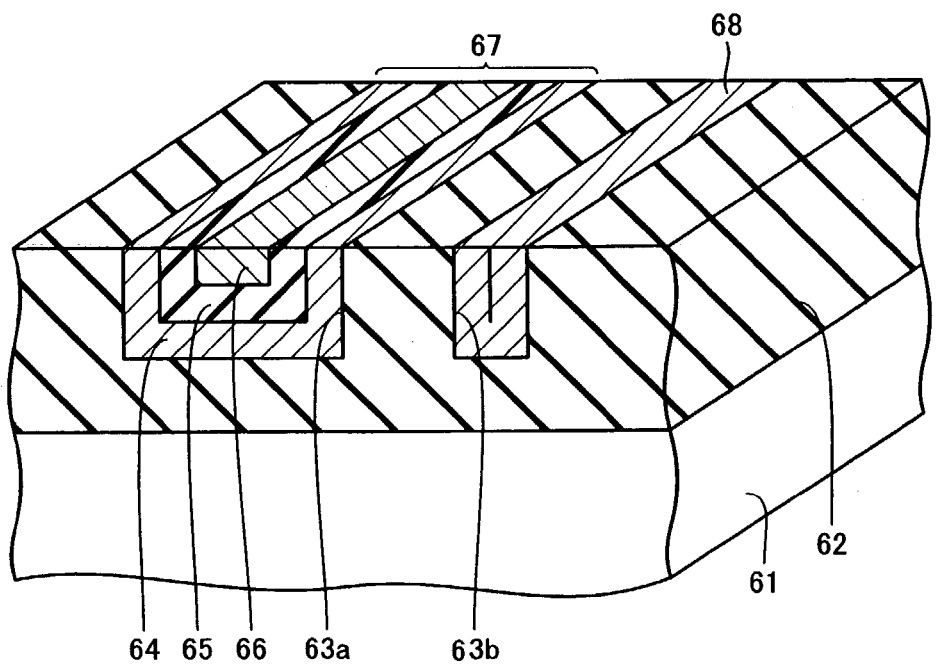
FIG. 11 is a perspective view showing a wiring board including a wiring structure according to a second embodiment of the present invention.
Figure 12:
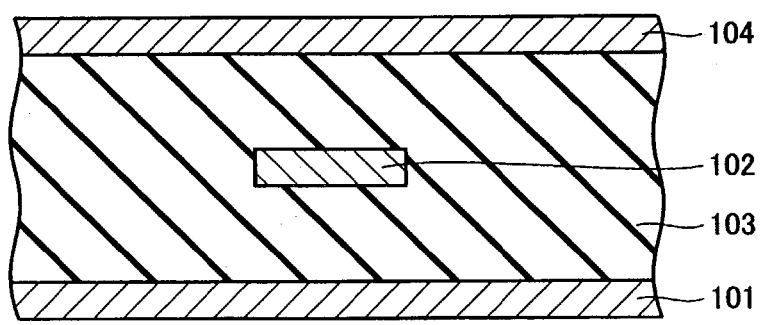
FIG. 12 is a sectional view showing a stripline structure employed for a conventional wiring board.

The transmission line structure of the semiconductor device according to any of the first to fourth modifications of the first embodiment shown in FIGS. 7 to 10 may be employed as a modification of the transmission line structure of the wiring board 61 according to the second embodiment shown in FIG. 11.

While the trapezoidal trench 53a similar to the trapezoidal trench 23a according to the first modification of the first modification shown in FIG. 7 has circular bottom corners in the fourth modification of the first embodiment shown in FIG. 10, the present invention is not restricted to this but the rectangular trench 13a according to the first embodiment shown in FIG. 1 may alternatively have circular bottom corners.

While the inner and outer wires 16 and 14 are made of copper according to the first embodiment, the present invention is not restricted to this but the inner and outer wires 16 and 14 may alternatively be made of another metal such as tungsten (W) or titanium (Ti) or an alloy thereof, or formed by a multilayer film of such metal(s) or alloy(s).

While the insulator film 15 arranged between the inner and outer wires 16 and 14 consists of an $SiO_2$ film in the aforementioned first embodiment, the present invention is not restricted to this but the insulator film 15 may alternatively be made of another material so far as this material has a higher dielectric constant than the $SiO_2$ film. For example, an SiN film is also employable for the insulator film 15.

What is claimed is:

1. A wiring structure comprising:
   a first trench formed on a first single insulator film provided on a substrate;
   a first wire formed in the extensional direction of said first trench along at least part of the inner surface of said first trench; and
   a second wire formed to be opposed to said first wire through a second insulator film for forming a transmission line for transmitting signals with said first wire, wherein:
   said first wire, said second insulator film and said second wire are embedded in said first trench, and
   a depth of said first trench is smaller than a thickness of said first single insulator film.

2. The wiring structure according to claim 1, wherein
   said first wire is formed to cover substantially the overall inner surface of said first trench along the inner surface of said first trench, and
   said second wire formed to be opposed to said first wire through said second insulator film is so formed that said first wire encloses the surface opposed to said first wire.

3. The wiring structure according to claim 2, wherein
   said first wire includes a shield wire, and
   said second wire includes a signal wire.

4. The wiring structure according to claim 1, further comprising:
   a second trench formed on said first single insulator film provided on said substrate at a prescribed interval from said first trench, and
   a third wire formed to fill up said second trench.

5. The wiring structure according to claim 4, wherein
   said third wire and said first wire consist of layers formed through the same process.

* * * * *